(12) United States Patent
Wenxu et al.

(10) Patent No.: US 9,722,068 B2
(45) Date of Patent: Aug. 1, 2017

(54) SEMICONDUCTOR DEVICES AND METHODS OF MANUFACTURING THE SAME

(71) Applicant: Samsung Electronics Co., Ltd., Suwon-si, Gyeonggi-do (KR)

(72) Inventors: Xianyu Wenxu, Suwon-si (KR); Yongsung Kim, Namyangju-si (KR); Changyoul Moon, Suwon-si (KR); Yongyoung Park, Daejeon (KR); Wooyoung Yang, Hwaseong-si (KR); Jeongyub Lee, Seoul (KR); Jooho Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/026,681

(22) PCT Filed: Sep. 16, 2014

(86) PCT No.: PCT/KR2014/008591
§ 371 (c)(1),
(2) Date: Apr. 1, 2016

(87) PCT Pub. No.: WO2015/050328
PCT Pub. Date: Apr. 9, 2015

(65) Prior Publication Data
US 2016/0247906 A1 Aug. 25, 2016

(30) Foreign Application Priority Data

Oct. 1, 2013 (KR) .................. 10-2013-0117592

(51) Int. Cl.
*H01L 29/78* (2006.01)
*H01L 29/45* (2006.01)
(Continued)

(52) U.S. Cl.
CPC ........ *H01L 29/78* (2013.01); *H01L 21/30625* (2013.01); *H01L 21/31051* (2013.01);
(Continued)

(58) Field of Classification Search
CPC ...................................................... H01L 29/78
(Continued)

(56) References Cited

U.S. PATENT DOCUMENTS 8,274,098 B2   9/2012   Chung et al.
8,637,851 B2   1/2014   Cho et al.
(Continued)

FOREIGN PATENT DOCUMENTS

KR    20130019700 A    2/2013
KR    2013-0022854 A   3/2013

OTHER PUBLICATIONS

International Search Report PCT/ISA/210 for International Application No. PCT/KR2014/008591 Dated Dec. 19, 2014.

*Primary Examiner* — Jami M Valentine
(74) *Attorney, Agent, or Firm* — Harness, Dickey & Pierce P.L.C.

(57) ABSTRACT

Provided are semiconductor devices and methods of manufacturing the same. A semiconductor device may include a source, a drain, a semiconductor element between the source and the drain, and a graphene layer that is provided on the source and the semiconductor element and is spaced apart from the drain. Surfaces of the source and the drain are substantially co-planar with a surface of the semiconductor element. The semiconductor element may be spaced apart from the source and may contact the drain. The graphene layer may have a planar structure. A gate insulating layer and a gate may be provided on the graphene layer. The semiconductor device may be a transistor. The semiconductor (Continued)

device may have a barristor structure. The semiconductor device may be a planar type graphene barristor.

19 Claims, 15 Drawing Sheets

(51) Int. Cl.
    *H01L 29/66*     (2006.01)
    *H01L 29/778*     (2006.01)
    *H01L 29/06*     (2006.01)
    *H01L 29/16*     (2006.01)
    *H01L 21/306*     (2006.01)
    *H01L 21/3105*     (2006.01)
    *H01L 29/08*     (2006.01)
    *H01L 29/10*     (2006.01)
    *H01L 29/24*     (2006.01)
    *H01L 29/423*     (2006.01)
    *H01L 29/47*     (2006.01)

(52) U.S. Cl.
    CPC ...... *H01L 29/0653* (2013.01); *H01L 29/0847* (2013.01); *H01L 29/1033* (2013.01); *H01L 29/1606* (2013.01); *H01L 29/24* (2013.01); *H01L 29/4238* (2013.01); *H01L 29/42364* (2013.01); *H01L 29/45* (2013.01); *H01L 29/47* (2013.01); *H01L 29/66045* (2013.01); *H01L 29/7781* (2013.01)

(58) Field of Classification Search
    USPC .......................................................... 257/27
    See application file for complete search history.

(56) References Cited

U.S. PATENT DOCUMENTS

| | | | |
|---|---|---|---|
| 8,673,703 B2 | 3/2014 | Lin et al. | |
| 9,064,777 B2 | 6/2015 | Heo et al. | |
| 9,099,561 B2 | 8/2015 | Kim et al. | |
| 2008/0312088 A1 | 12/2008 | Chung et al. | |
| 2010/0258787 A1 | 10/2010 | Chae et al. | |
| 2011/0114918 A1 | 5/2011 | Lin et al. | |
| 2012/0104381 A1 | 5/2012 | Shieh et al. | |
| 2012/0248503 A1 | 10/2012 | Huo et al. | |
| 2012/0261645 A1* | 10/2012 | Cho | H01L 29/1606 257/29 |
| 2012/0326126 A1 | 12/2012 | Chen et al. | |
| 2012/0326228 A1 | 12/2012 | Guo et al. | |
| 2013/0001518 A1 | 1/2013 | Lin et al. | |
| 2013/0075700 A1* | 3/2013 | Yang | H01L 29/45 257/27 |
| 2014/0231752 A1* | 8/2014 | Shin | H01L 29/1606 257/29 |

\* cited by examiner

SEMICONDUCTOR DEVICES AND METHODS OF MANUFACTURING THE SAME

CROSS-REFERENCE TO RELATED APPLICATIONS

This application is a national phase under 35 U.S.C. §371 of PCT International Application No. PCT/KR2014/008591 which has an International filing date of Sep. 16, 2014, which claims priority to Korean Application No. 10-2013-0117592, filed Oct. 1, 2013, the entire contents of each of which are hereby incorporated by reference.

TECHNICAL FIELD

The present disclosure relates to semiconductor devices and methods of manufacturing the same, and more particularly, to semiconductor devices including graphene and methods of manufacturing the same.

BACKGROUND ART

Graphene is a single-layer hexagonal structure formed of carbon atoms and may have structural and chemical stability, and general exhibit good electrical and physical characteristics. For example, graphene has a charge mobility of up to about $2\times10^5$ cm$^2$/Vs, which is 100 times or more faster than the charge mobility of silicon (Si), and a current density of about $10^8$ A/cm$^2$, which is 100 times or more greater than the current density of copper (Cu). Thus, graphene has drawn attention as a next generation material capable of overcoming the limitations of related art materials.

Because graphene has various advantages, research into employing graphene in various electronic devices (for example, transistors) has been underway. However, since graphene is vulnerable to plasma processes or sputtering processes, graphene may easily be damaged in an actual manufacturing process of a device, and consequently, characteristics of graphene may be deteriorated. Also, graphene is generally attached to a patterned structure by a transfer process after being grown on a catalytic metal. Accordingly, when a step portion exists on a surface of the patterned structure, contact with graphene may present a problem. The problem may be even greater as a size of the device to be manufactured is smaller. Thus, as for manufacturing of a semiconductor device (an electronic device) employing graphene, in order to fully utilize the good characteristics of graphene, and example design and a method of preventing damage to graphene may improve the contact characteristics of graphene.

DISCLOSURE OF INVENTION

Technical Problem

Since graphene is vulnerable to plasma processes or sputtering processes, graphene may easily be damaged in an actual manufacturing process of a device, and consequently, characteristics of graphene may be deteriorated. Also, graphene is generally attached to a patterned structure by a transfer process after being grown on a catalytic metal. Accordingly, when a step portion exists on a surface of the patterned structure, contact with graphene may present a problem. The problem may be even greater as a size of the device to be manufactured is smaller.

Solution to Problem

Provided are a semiconductor device (for example, a transistor) in which damage to graphene is reduced (or, alternatively prevented/suppressed) and a method of manufacturing the same, according to an example embodiment.

Provided are a semiconductor device (for example, a transistor) having good contact characteristic between graphene and a substructure (semiconductor or conductor) and a method of manufacturing the same, according to an example embodiment.

Provided are a semiconductor device (for example, a transistor) including graphene that has a structure which is advantageous for scale down and a method of manufacturing the same, according to an example embodiment.

Provided are a semiconductor device (for example, a transistor) including graphene that may be easily manufactured and have good characteristics and a method of manufacturing the same, according to an example embodiment.

Additional example embodiments will be set forth in part in the description which follows and, in part, will be apparent from the description, or may be learned by practice of the presented example embodiments.

According to an example embodiment, a semiconductor device includes: a source and a drain that are spaced apart from each other; a semiconductor element between the source and the drain, the semiconductor element being spaced apart from the source and contacting the drain; a graphene layer provided on the source and the semiconductor element to connect the source and the semiconductor element, the graphene layer being spaced apart from the drain; a gate insulating layer provided on the graphene layer; and a gate provided on the gate insulating layer above the semiconductor element.

Surfaces of the source and the drain may have the same level as a surface of the semiconductor element, or are substantially co-planar with a surface of the semiconductor element, according to an example embodiment.

A level difference between surfaces of the source and the drain and a surface of the semiconductor element may be about 5 nm or less or about 3 nm or less, according to an example embodiment.

An isolation layer may be provided between the source and the semiconductor element and around the source and the drain, according to an example embodiment.

A level difference between surfaces of the source and the drain and a surface of the isolation layer may be about 5 nm or less or about 3 nm or less, according to an example embodiment.

The graphene layer may have a flat structure.

The semiconductor element may include an n-type semiconductor or a p-type semiconductor.

The semiconductor element may include at least one of silicon (Si), germanium (Ge), silicon germanium (SiGe), and strained Si.

The semiconductor device may further include a passivation layer covering the source, the drain, the gate insulating layer, and the gate; and a source pad and a drain pad that are provided on the passivation layer and are electrically connected to the source and the drain, respectively, according to an example embodiment.

The source and the drain may include an impurity-doped region.

The source and the drain may include metal silicide.

The source and the drain may include a metal or a metal compound.

The source and the drain may be formed on a silicon substrate or a silicon-on-insulator (SOI) substrate.

The semiconductor device may have a barristor device structure.

According to another example embodiment, a method of manufacturing a semiconductor device includes: preparing a device region including a source, a drain, and a semiconductor element between the source and the drain, the semiconductor element being spaced apart from the source and contacting the drain; forming a graphene layer on the source and the semiconductor element, the graphene layer being spaced apart from the drain; forming a gate insulating layer on the graphene layer; and forming a gate on the gate insulating layer above the semiconductor element.

The preparing of the device region may further include: forming an isolation layer in a substrate, wherein the isolation layer defines regions for the source, the drain, and the semiconductor element; and performing a planarization process with respect to surfaces of the regions for the source, the drain, and the semiconductor element and a surface of the isolation layer, according to an example embodiment.

The planarization process may include a chemical mechanical polishing (CMP) process.

An etch stop layer may be selectively used in the CMP process.

The device region may be formed on a silicon (Si) substrate or a silicon-on-insulator (SOI) substrate.

The source and the drain may include an impurity-doped region.

The source and the drain may include metal silicide.

The source and the drain may include a metal or a metal compound.

MODE FOR THE INVENTION

Figure 1:
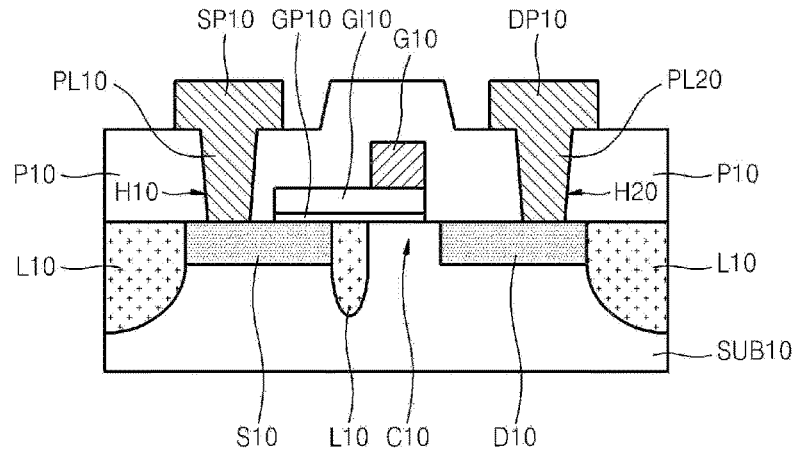
FIG. 1 is a cross-sectional view of a semiconductor device according to an example embodiment.

Various example embodiments will now be described more fully with reference to the accompanying drawings in which example embodiments are shown.

It will be understood that when an element is referred to as being "on," "connected" or "coupled" to another element, it can be directly on, connected or coupled to the other element or intervening elements may be present. In contrast, when an element is referred to as being "directly on," "directly connected or "directly coupled to another element, there are no intervening elements present. As used herein the term "and/or" includes any and all combinations of one or more of the associated listed items. Expressions such as "at least one of," when preceding a list of elements, modify the entire list of elements and do not modify the individual elements of the list.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Reference will now be made in detail to embodiments, examples of which are illustrated in the accompanying drawings, wherein like reference numerals refer to the like elements throughout. In this regard, the example embodiments may have different forms and should not be construed as being limited to the descriptions set forth herein. Accordingly, the example embodiments are merely described below, by referring to the figures, to explain example embodiments of the present description.

FIG. 1 is a cross-sectional view of a semiconductor device according to an example embodiment. The semiconductor device according to the example embodiment may be a transistor including graphene. Also, the semiconductor device may have a barristor device structure.

Referring to FIG. 1, a source region S10 and a drain region D10 may be provided on a surface portion of a substrate SUB10, and a semiconductor region C10 may be provided between the source region S10 and the drain region D10. The semiconductor region C10 may be spaced apart from the source region S10 and may contact the drain region D10. The substrate SUB10 may be a desired (or, alternatively, predetermined) semiconductor substrate, for example, a silicon (Si) substrate or other substrate. A type of the substrate SUB10 is not limited to the Si substrate but may vary. For example, the substrate SUB10 may include at least one material selected from a group consisting of silicon (Si), germanium (Ge), silicon germanium (SiGe), and strained Si. The substrate SUB10 may also include other material. SiGe may be formed on Si and strained Si may be formed on SiGe. The substrate SUB10 may be a p-type or an n-type semiconductor. Here, an impurity doping concentration of the substrate SUB10 may be, for example, about $10^{13}/cm^3$ to about $10^{16}/cm^3$. Considering this impurity doping concentration, the substrate SUB10 may be a p-substrate or an n-substrate. The source region S10 and the drain region D10 may be highly doped regions. For example, the source region S10 and the drain region D10 may be regions in which an n-type impurity or a p-type impurity is doped in a concentration of $10^{17}/cm^3$ or more or $10^{18}/cm^3$ or more. Considering this impurity doping concentration, the source region S10 and the drain region D10 may be an n+ region or a p+ region. The semiconductor region C10 may be a portion of the substrate SUB10. The semiconductor region C10 may be formed of the same material as the substrate region SUB10 under the source region S10 and the drain region D10 and may have the same impurity doping concentration as the substrate region SUB10 under the source region S10 and the drain region D10. Thus, the semiconductor region C10 may include at least one material selected from the group consisting of Si, Ge, SiGe, and strained Si. The semiconductor region C10 may be a "channel region."

In at least one example embodiment, an isolation layer L10 that defines the source region S10, the drain region D10, and the semiconductor region C10 may be provided in the substrate SUB10. That is, the isolation layer L10 may be provided between the source region S10 and the semiconductor region C10 and around the source region S10 and the drain region D10. The isolation layer L10 may be referred to as a "device isolation layer" and be formed of an insulating material (for example, oxide). When the isolation layer L10 is formed of oxide (for example, silicon oxide), the isolation layer L10 may be referred to as a "field oxide." The source region S10 and the semiconductor region C10 may be electrically isolated by the isolation layer L10. Also, the device (the transistor) illustrated in FIG. 1 may be electrically isolated from adjacent other devices (not shown) by the isolation layer L10.

In at least one example embodiment, surfaces of the source region S10 and the drain region D10 may have the same (or almost the same) level as a surface of the semiconductor region C10. Also, the surfaces of the source region S10 and the drain region D10 may have the same (or almost the same) level as a surface of the isolation layer L10. If there is a level difference between the surfaces of the source region S10 and the drain region D10 and the surface of the isolation layer L10, the difference may be as small as about 5 nm or less or about 3 nm or less. Thus, the surfaces of the source region S10, the drain region D10, the semiconductor region C10, and the isolation layer L10 may form flat surfaces on the same level (or substantially the same level).

In at least one example embodiment, a graphene layer GP10 may be provided on the source region S10 and the semiconductor region C10 to connect the source region S10 and the semiconductor region C10. The graphene layer GP10 may have a planar structure or an almost planar structure. The graphene layer GP10 may be provided on the semiconductor region C10, and may have a structure extending to a portion of the source region S10 that is near to the semiconductor region C10. The graphene layer GP10 may be spaced apart from the drain region D10. Thus, the graphene layer GP10 may be electrically isolated from the drain region D10. The distance between the graphene layer GP10 and the drain region D10 may be about 5 nm to about 100 nm, but it is an example and the distance may vary. The graphene layer GP10 may be a single layer graphene, that is, a graphene sheet, for example. Alternatively, the graphene layer GP10 may be a stack of a plurality of graphene layers (for example, about 10 layers or less). A Schottky barrier may exist in an interface between the graphene layer GP10 and the semiconductor region C10. That is, the contact between the graphene layer GP10 and the semiconductor region C10 may be a Schottky contact. Meanwhile, the contact between the graphene layer GP10 and the source region S10 may be an ohmic contact. The graphene layer GP10 may be grown on another substrate (not shown) and then transferred onto the substrate SUB10 of FIG. 1.

A gate insulating layer GI10 may be provided on the graphene layer GP10. The gate insulating layer GI10 may, for example, be formed of aluminum oxide, silicon oxide, silicon oxynitride, silicon nitride, or a high dielectric material having a higher dielectric constant than silicon nitride. A gate G10 may be provided on the gate insulating layer GI10. The gate G10 may be provided on the gate insulating layer GI10 above the semiconductor region C10. Here, a case in which a right side surface of the gate G10 is in the same vertical line as a right side surface of the gate insulating layer GI10 has been illustrated, but their relative locations may vary. For example, the right side surface of the gate insulating layer GI10 may be disposed closer to the drain region D10 than the right side surface of the gate G10.

In at least one example embodiment, an electrical characteristic between the semiconductor region C10 and the graphene layer GP10 may be controlled by the gate G10. To describe in detail, a height of the Schottky barrier between the graphene layer GP10 and the semiconductor region C10 may be controlled according to a voltage applied to the gate G10. When the height of the Schottky barrier decreases, the semiconductor device (for example, the transistor) according to an example embodiment may be turned on, and, when the height of the Schottky barrier increases, the semiconductor device (for example, the transistor) may be turned off. In addition, when the semiconductor device (for example, the transistor) is turned on, a channel may be formed in the semiconductor region C10. Therefore, when the semiconductor device (for example, the transistor) is turned on, a current may flow between the source region S10 and the drain region D10 through the graphene layer GP10 and the semiconductor region C10. Most of the current may flow through the graphene layer GP10 and the rest may flow through the semiconductor region C10.

In at least one example embodiment, a passivation layer P10 covering the source region S10, the drain region D10, the gate insulating layer GI10, and the gate G10 may further be provided on the substrate SUB10. The passivation layer P10 may, for example, be formed of silicon oxide, silicon nitride, silicon oxynitride, or an organic insulating material. A source pad SP10 electrically connected to the source region S10 and a drain pad DP10 electrically connected to the drain region D10 may further be provided on the passivation layer P10. The source pad SP10 may be connected to the source region S10 by a first plug PL10 provided in a first contact hole H10 of the passivation layer P10. Likewise, the drain pad DP10 may be connected to the drain region D10 by a second plug PL20 provided in a second contact hole H20 of the passivation layer P10. The source pad SP10 and the drain pad DP10 may be formed of a desired (or, alternatively, predetermined) metal, a metal compound, or the like. The source pad SP10 and the drain pad DP10 may be an "electrode" or an "electrode pad." The first and second plugs PL10 and PL20 may be formed of a conductive material, and may be formed of the same material as the source and drain pads SP10 and DP10, but it is not limited thereto. The first and second plugs PL10 and P120 may be a "contact plug."

Figure 2:
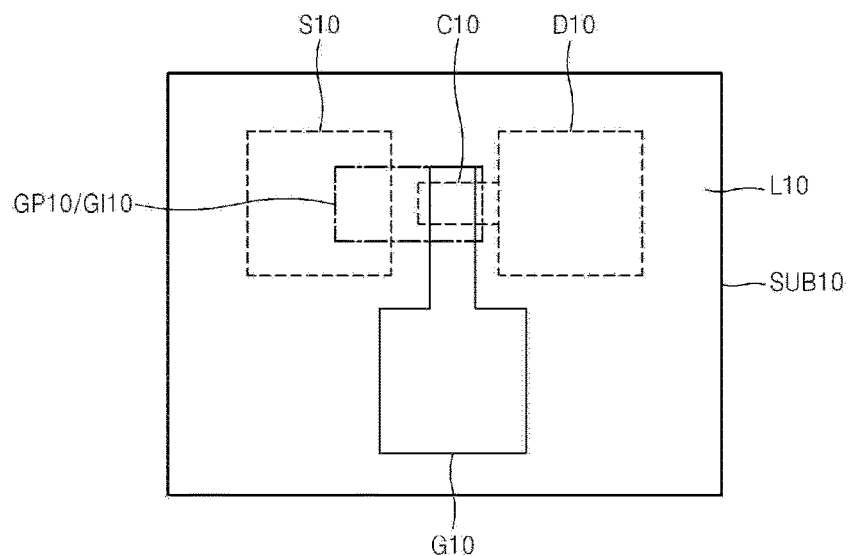
FIG. 2 is a plan view illustrating a planar structure of main elements of the semiconductor device of FIG. 1.

FIG. 2 is a plan view illustrating a planar structure of main elements of the semiconductor device of FIG. 1, according to an example embodiment.

Referring to FIG. 2, the source region S10 and the drain region D10 that are spaced apart from each other may be provided in the substrate SUB10. The semiconductor region C10 may be provided between the source region S10 and the drain region D10. The semiconductor region C10 may be spaced apart from the source region S10 and may contact the drain region D10. A width and size of the semiconductor region C10 may be smaller than those of the source region S10 and the drain region D10, according to an example embodiment. The semiconductor region C10 may have a structure extending from a left central portion of the drain region D10 toward the source region S10. The isolation layer L10 may be provided around the source region S10, the drain region D10, and the semiconductor region C10. The source region S10, the drain region D10, and the semiconductor region C10 may be electrically isolated from another device portion (not shown) by the isolation layer L10. Also, the source region S10 and the semiconductor region C10 may be electrically isolated from each other by the isolation layer L10. The graphene layer GP10 may be provided on the source region S10, the semiconductor region C10, and the isolation layer L10 region therebetween. The gate insulating layer GI10 may be provided on the graphene layer GP10. The graphene layer GP10 and the gate insulating layer GI10 may be spaced apart from the drain region D10. The gate G10 may be provided on the gate insulating layer GI10. The gate G10 may extend in a direction perpendicular to a line connecting the source region S10 and the drain region D10 and may have a pad portion of a great width in one end, according to an example embodiment.

The structure of FIGS. 1 and 2 may vary. For example, the material and configuration of the source region S10, the drain region D10, and the semiconductor region C10 of FIGS. 1 and 2 may vary. FIGS. 3 through 6 illustrate the examples.

Figure 3:
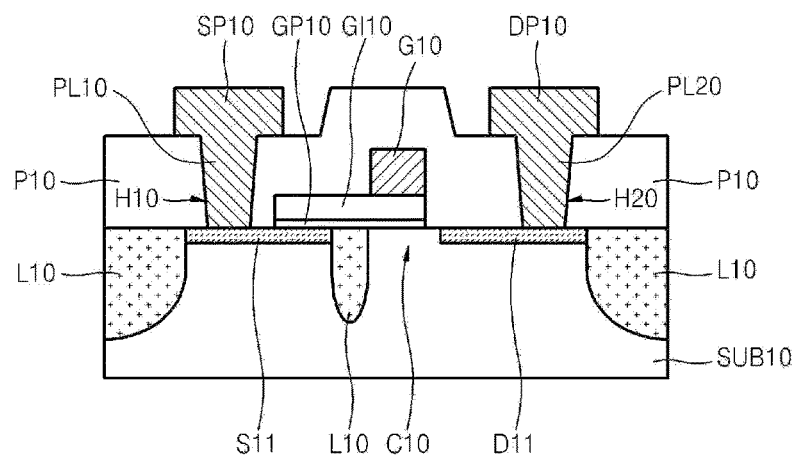
FIG. 3 is a cross-sectional view of a semiconductor device according to another example embodiment.

FIG. 3 is a cross-sectional view of a semiconductor device according to another example embodiment. FIG. 3 illustrates a case in which a source region S11 and a drain region D11 are formed of metal silicide.

Referring to FIG. 3, the source region S11 and the drain region D11 may be formed of metal silicide, according to an example embodiment. For example, the source region S11 and the drain region D11 may be formed of metal silicide, such as $TiSi_2$, $CoSi$, $CoSi_2$, $NiSi$, $NiSi_2$, $PtSi$, $Pd_2Si$, $WSi_2$, $MoSi_2$, and $TaSi_2$. The rest configuration of FIG. 3 except the source region S11 and the drain region D11 may be the same as the configuration of FIG. 1.

Figure 4:
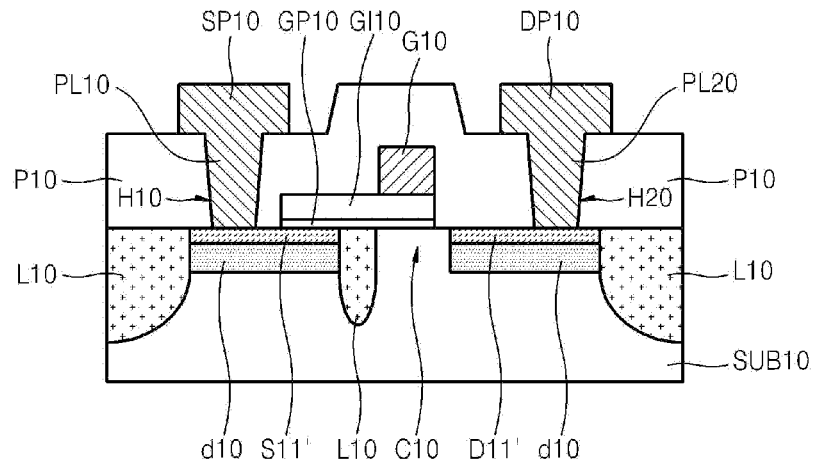
FIG. 4 is a cross-sectional view of a semiconductor device according to yet another example embodiment.

FIG. 4 is a cross-sectional view of a semiconductor device according to yet another example embodiment. FIG. 4 illustrates a case in which a source region S11' and a drain region D11' are provided on a doping region d10. Here, the source region S11' and the drain region D11' may be formed of metal silicide.

Referring to FIG. 4, the doping region d10 may be provided in a surface portion of the substrate SUB10, and the source region S11' and the drain region D11' may be provided on the doping region d10, according to an example embodiment. The doping region d10 may be a region that is doped with a desired (or, alternatively, predetermined) impurity. The doping concentration of the doping region d10 may be higher than the doping concentration of the substrate SUB10. The doping concentration of the doping region d10 may be similar to or lower than the doping concentration of the source region S10 and the drain region D10 of FIG. 1. The source region S11' and the drain region D11' may be formed by changing an upper surface portion of the doping region d10 to metal silicide. Therefore, the source region S11' and the drain region D11' may be identical or similar to the source region S11 and the drain region D11 of FIG. 3.

Figure 5:
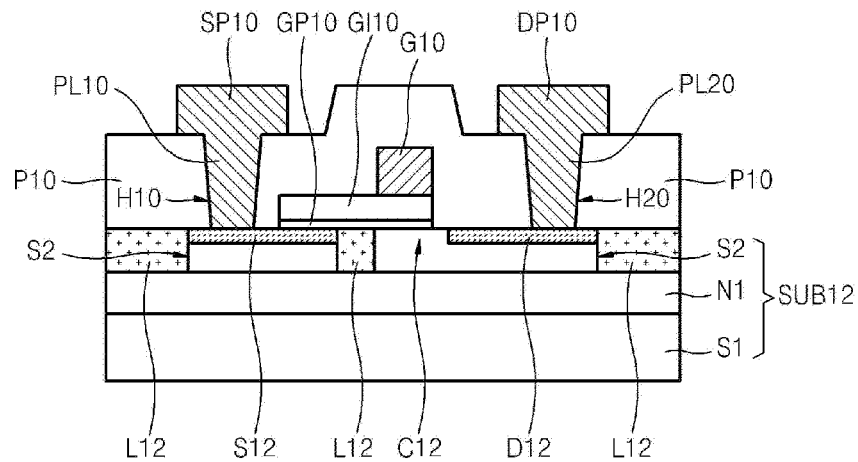
FIG. 5 is a cross-sectional view of a semiconductor device according to yet another example embodiment.

FIG. 5 is a cross-sectional view of a semiconductor device according to yet another example embodiment. FIG. 5 illustrates a case in which a source region S12, a drain region D12, and a semiconductor element C12 are formed on a silicon-on-insulator (SOI) substrate. Here, the source region S12 and the drain region D12 may include metal silicide, according to an example embodiment.

Referring to FIG. 5, a substrate SUB12 may include a lower silicon S1, an insulating layer N1, and an upper silicon S2, according to an example embodiment. The insulating layer N1 may be provided between the lower silicon S1 and the upper silicon S2. The insulating layer N1 may, for example, be formed of silicon oxide. The upper silicon S2 may have a patterned structure and an isolation layer L12 may be provided around the upper silicon S2. A source region S12, a drain region S12, and a semiconductor element C12 may be provided in the upper silicon S2. The source region S12 and the drain region D12 may be spaced apart from each other. The semiconductor element C12 may be provided between the source region S12 and the drain region D12. The semiconductor element C12 may be spaced apart from the source region S12 and may contact the drain region D12. The source region S12 and the drain region D12 may be formed of metal silicide, according to an example embodiment. The source region S12 and the drain region D12 may be formed by changing some portions of the upper silicon S2 to metal silicide by a silicide process. The source region S12 and the drain region D12 may be formed by an impurity doping (ion implantation) process instead of the silicide process. The semiconductor element C12 may be a portion of the upper silicon S2 and may be a p-type semiconductor or an n-type semiconductor. A doping concentration of the semiconductor element C12 may be identical or similar to that of the substrate SUB10 of FIG. 1.

Surfaces of the source region S12, the drain region D12, the semiconductor element C12, and the isolation layer L12 may form a flat (or almost flat) surface, according to an example embodiment. The graphene layer GP10, the gate insulating layer GI10, the gate G10, the passivation layer P10, the source pad SP10, and the drain pad DP10 may be provided on the flat surface. The graphene layer GP10, the gate insulating layer GI10, the gate G10, the passivation layer P10, the source pad SP10, and the drain pad DP10 may be identical or similar to those of FIG. 1.

Figure 6:
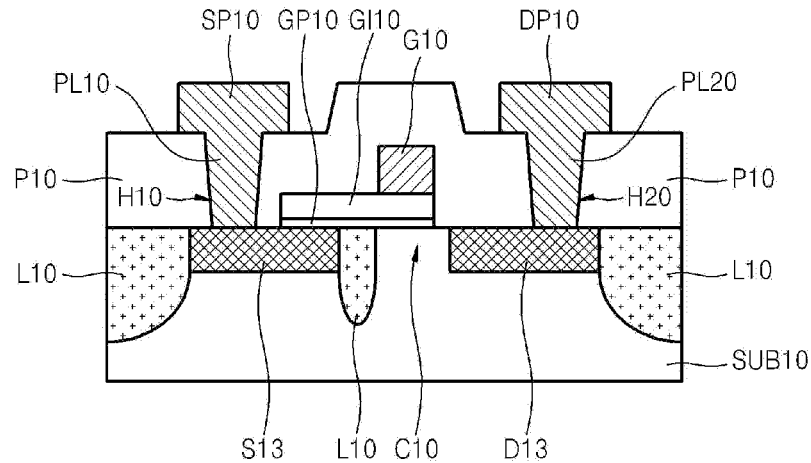
FIG. 6 is a cross-sectional view of a semiconductor device according to yet another example embodiment.

FIG. 6 is a cross-sectional view of a semiconductor device according to yet another example embodiment. FIG. 6 illustrates a case in which a source element S13 and a drain element D13 are formed of a metal or a metal compound.

Referring to FIG. 6, the source element S13 and the drain element D13 may be formed of a metal or a metal compound. For example, the source element S13 and the drain element D13 may include at least one of various metals and metal compounds, such as Ti, Al, Au, TiN, Pt, Ni, or the like. In this case, the source element S13 and the drain element D13 may be formed by removing a portion of the substrate SUB10 by etching, and filling the removed portion with a metal or a metal compound. The rest material and configuration of FIG. 6 except the material and configuration of the source element S13 and the drain element D13 may be identical or similar to the configuration of FIG. 1.

The semiconductor device according to the example embodiments described with reference to FIGS. 1 through 6 may be a transistor. The semiconductor device may be a transistor including graphene. Also, the semiconductor device may have a barristor device structure. That is, the semiconductor device may be a graphene barristor. As illustrated in FIGS. 1 through 6, since a surface of the substructure (that is, the substrate structure) on which the source region/element S10, S11, S11', S12, and S13 and the drain region/element D10, D11, D11', D12, and D13 are formed is flat and the graphene layer GP10 is formed on the flat surface, a contact characteristic between the graphene layer GP10 and the substructure (that is, the substrate structure) may be excellent. For example, an excellent contact characteristic (interface characteristic) between the graphene layer GP10 and the semiconductor region/element C10 and C12 may be obtained. Even if a size of the device decreases, the contact characteristic between the graphene layer GP10 and the substructure (the substrate structure) may be easily secured. Therefore, the semiconductor device according to the example embodiments may have high performance and be advantageous for scale down.

Moreover, in the semiconductor device according to the example embodiments, a hole forming process with respect to the graphene layer GP10 is not required, and thus, damage to the graphene layer GP10 may be reduced, minimized or alternatively prevented. The graphene layer GP10 is formed after the source region/element S10, S11, S11', S12, and S13 and the drain region/element D10, D11, D11', D12, and D13 are formed. Then, the graphene layer G10 is covered with the gate insulating layer GI10, and a sequential process may be performed. In addition, because a hole open process with respect to the graphene layer GP10 is not performed, according to an example embodiment, the graphene layer GP10 may not be exposed to a plasma process or a sputtering process. Therefore, the graphene layer GP10 may be ultimately prevented from having deteriorated characteristics because of damage to the graphene layer GP10 by the plasma process or the sputtering process. With regard to this, the semiconductor device maintaining an excellent graphene characteristic may be manufactured.

Furthermore, in the semiconductor device according to the example embodiments, since the graphene layer GP10 is formed on the substructure after the source region/element S10, S11, S11', S12, and S13 and the drain region/element D10, D11, D11', D12, and D13 are formed first on the substrate SUB10 and SUB12, a degree of freedom for a process may increase. After the graphene layer GP10 is formed, a sequential process may be performed, with the graphene layer GP10 being protected by the gate insulating layer GI10 and the passivation layer P10. Also, an open process with respect to the graphene layer GP10 may not be performed. If a source element and a drain element are formed after the graphene layer GP10 is formed, the sequential process may have various limitations due to the graphene layer GP10. However, according to the example embodiments, since the source element and the drain element are formed in the substrate SUB10 or SUB12 by using a previous complementary metal-oxide-semiconductor (CMOS) process, and then the graphene layer GP10 is transferred on the source element and the drain element, a process progress may be easy and a degree of freedom for the process may increase.

Figure 14:
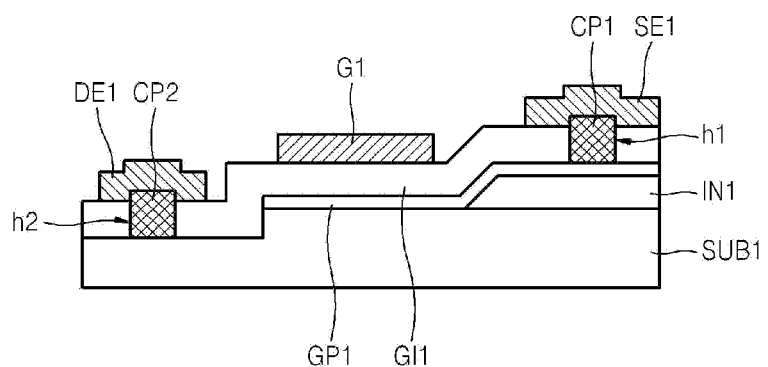
FIG. 14 is a cross-sectional view of a semiconductor device according to a comparative example.

FIG. 14 is a cross-sectional view of a semiconductor device according to a comparative example. The semiconductor device according to the comparative example may be a transistor according to a related art.

Referring to FIG. 14, a substrate SUB1 including a p-type or an n-type semiconductor is prepared. A surface of the substrate SUB1 may not be flat and may have an uneven structure. Also, since an insulating layer IN1 is provided on a portion of the substrate SUB1, a step portion may occur by the insulating layer IN1. A graphene layer GP1 is provided on the insulating layer IN1 and a portion of the substrate SUB1 on a side of the insulating layer IN1. A gate insulating layer GI1 covering the graphene layer GP1 is provided on the substrate SUB1. A gate G1 is provided on the gate insulating layer GI1. A first contact hole h1 and a second contact hole h2 exposing the graphene layer GP1 and the substrate SUB1 are formed in the gate insulating layer GI1. A first contact plug CP1 and a second contact plug CP2 are provided in the first and second contact holes h1 and h2. A source electrode SE1 contacting the first contact plug CP1 and a drain electrode DE1 contacting the second contact plug CP2 are provided on the gate insulating layer GI1.

In the semiconductor device according to the comparative example of FIG. 14, the graphene layer GP1 is formed (transferred) on the substructure having the step height, and thus, an excellent contact characteristic between the graphene layer GP1 and the substrate SUB1 is difficult to obtain. Also, as a size of the semiconductor device is smaller, the contact problem due to the step height increases. Furthermore, the contact hole h1 exposing the graphene layer GP1 is typically formed by etching the gate insulating layer GI1, and then the contact plug CP1 is formed in the contact hole h1. In this regard, the graphene layer GP1 is generally damaged in the etching process for forming the contact hole h1, thereby deteriorating a physical/electrical characteristic of the graphene layer GP1. Particularly, when the contact hole h1 is formed by dry etching, the graphene layer GP1 is typically damaged. Also, when the contact hole h1 is formed by wet etching, it is difficult to reduce a size of the contact hole h1, and thus, scale down may be difficult. In addition, when the semiconductor device is manufactured according to the comparative example, since the source electrode SE1 and the drain electrode DE1 are formed on the graphene layer GP1 after the graphene layer GP1 is formed, the graphene layer GP1 deteriorates in the process of forming the source electrode SE1 and the drain electrode DEL Also, the process of forming the source electrode SE1 and the drain electrode DE1 has limitations because of the graphene layer GP1. These problems according to the comparative example may be resolved or alleviated by the example embodiments.

FIGS. 7A through 7H are cross-sectional views for describing a method of manufacturing a semiconductor device according to an example embodiment.

Figure 7A:
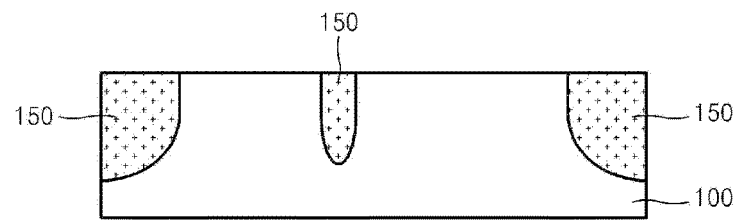
FIGS. 7A through 7H are cross-sectional views for describing a method of manufacturing a semiconductor device according to an example embodiment.

Referring to FIG. 7A, an isolation that defines a desired (or, alternatively, predetermined) device region may be formed in an upper surface portion of a substrate 100, according to an example embodiment. The substrate 100 may be a desired (or, alternatively, predetermined) semiconductor substrate, for example a Si substrate. A type of the substrate 100 is not limited to the Si substrate but may vary. For example, the substrate 100 may include at least one material selected from a group consisting of Si, Ge, SiGe, and strained Si. The substrate SUB10 may also include other material. SiGe may be formed on Si, and strained Si may be formed on SiGe. The substrate 100 may be a p-type or an n-type semiconductor. Here, an impurity doping concentration of the substrate SUB10 may be, for example, about $10^{13}/cm^3$ to about $10^{16}/cm^3$. Considering this impurity doping concentration, the substrate 100 may be a p− substrate or an n− substrate. The isolation layer 150 may be referred to as a "device isolation layer" and formed of an insulating material (for example, oxide). When the isolation layer 150 is formed of an oxide (for example, silicon oxide), the isolation layer 150 may be referred to as a "field oxide." The isolation layer 150 may have the same structure as the isolation layer L10 of FIGS. 1 and 2. A region of the substrate 100 that is exposed upward by the isolation layer 150 may be a "device region," or an "active region."

Figure 7B:
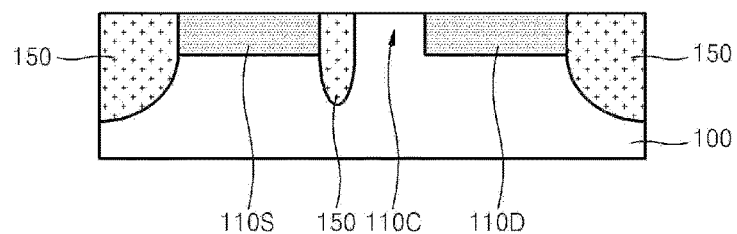

Referring to FIG. 7B, a source region 110S and a drain region 110D may be formed by an implantation process of impurity ion into a portion of the device region defined by the isolation layer 150, according to an example embodiment. The source region 110S and the drain region 110D may be regions in which an impurity is doped (ion implanted) in a high concentration. For example, the source region 110S and the drain region 110D may be regions in which an n-type impurity or a p-type impurity is doped in a concentration of $10^{17}/cm^3$ or more or of $10^{18}/cm^3$ or more. Considering this impurity doping concentration, the source region 110S and the drain region 110D may be an n+ region or a p+ region. By forming the source region 110S and the drain region 110D, a semiconductor region 110C may be defined between the source region 110S and the drain region 110D. The semiconductor region 110C may be spaced apart from the source region 110S by the isolation layer 150. The semiconductor region 110C may contact the drain region 110D. According to an example embodiment, the source region 110S, the drain region 110D, and the semiconductor region 110C may respectively correspond to the source region S10, the drain region D10, and the semiconductor region C10 of FIG. 1.

In the process of forming the isolation layer 150 of FIG. 7A, or after the process of forming the source region 110S and the drain region 110D of FIG. 7B, a planarization process with respect to surfaces the substrate 100 and the isolation layer 150 may be performed, according to an example embodiment. The planarization process may be performed, for example, by a chemical mechanical polishing (CMP) process. Alternatively, the planarization process may be performed by an etch-back process. By the planarization process, the surfaces of the substrate 100 and the isolation layer 150 may be made flat. Thus, surfaces of the source region 110S and the drain region 110D and the surface of the isolation layer 150 may form a flat surface on the same (or almost the same) level. Even if there is a level difference between the surfaces of the source region 110S and the drain region 110D and the surface of the isolation layer 150, the difference may be as small as about 5 nm or less or about 3 nm or less.

Figure 7C:
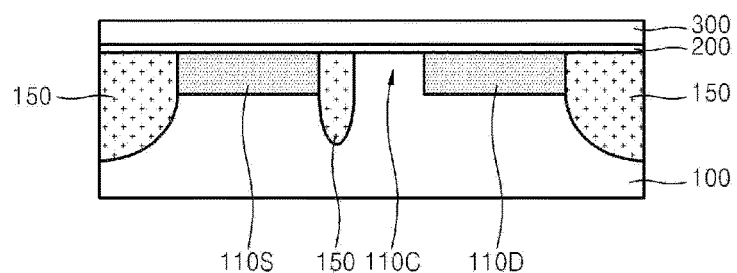

Referring to FIG. 7C, a graphene layer 200 may be formed on an upper surface of the substrate 100 on which the source region 110S, the drain region 110D, the semiconductor region 110C, and the isolation layer 150 are formed, according to an example embodiment. The graphene layer 200 may be grown on another substrate (not shown) and then transferred onto the substrate 100 of FIG. 7C. The method of transferring the graphene layer 200 is well-known, and thus, its description will be omitted. The graphene layer 200 may be a single layer graphene, that is, a graphene sheet, or a stack of a plurality of graphene sheets (for example, about 10 sheets or less). Next, a gate insulating layer 300 may be formed on the graphene layer 200. The gate insulating layer 300 may, for example, be formed of aluminum oxide, silicon oxide, silicon oxynitride, silicon nitride, or a high dielectric material having a higher dielectric constant than silicon nitride. The gate insulating layer 300 may be formed by a process that may not give damage to the graphene layer 200, for example, a process that does not use plasma. For example, the gate insulating layer 300 may be formed by an atomic layer deposition (ALD) method. However, it is only an example, and other methods may be used to form the gate insulating layer 300.

According to an example embodiment, since the graphene layer 200 is formed (transferred) on a flat surface, transferring of the graphene layer 200 may be easy and a contact characteristic between the graphene layer 200 and the substructure may be easily obtained. If the graphene layer GP1 is transferred on the substructure having the step height as illustrated in FIG. 14, the contact between the graphene layer GP1 and the substructure may be deficient. These contact deficiency problems may increase as a size of the device is smaller. However, according to the example embodiment, since the graphene layer 200 is formed (transferred) on the flat surface, the contact characteristic between the graphene layer 200 and the substructure may be excellent and be advantageous for scale down.

Figure 7D:
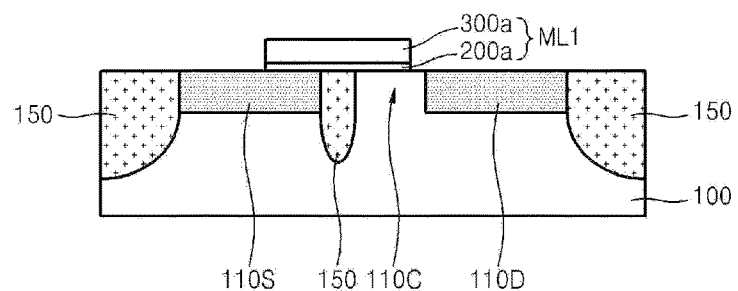

Next, a multi-layered structure (a stacked structure) ML1 as illustrated in FIG. 7D may be formed by patterning the gate insulating layer 300 and the graphene layer 200, according to an example embodiment. Reference numerals 200*a* and 300*a* respectively denote "the patterned graphene layer" and "the patterned gate insulating layer." The patterned graphene layer (hereinafter the graphene layer) 200*a* may be provided between the source region 110S and the semiconductor region 110C to connect the source region 110S and the semiconductor region 110C. The graphene layer 200*a* may be electrically isolated from the drain region 110D by being spaced apart from the drain region 110D. The distance between the graphene layer 200*a* and the drain region 110D may be, for example, about 5 nm to about 100 nm, but the distance may vary.

Figure 7E:
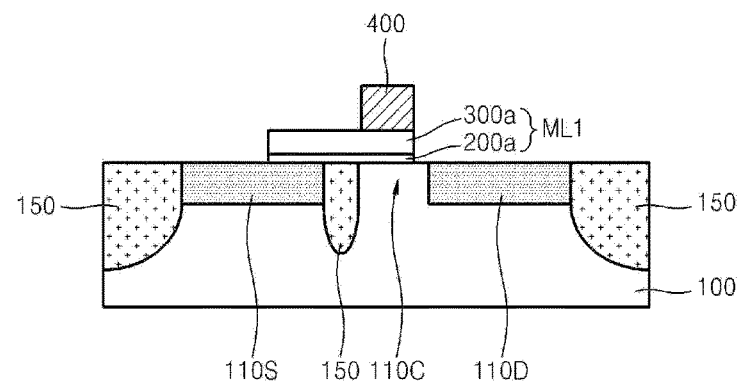

Referring to FIG. 7E, a gate 400 may be formed on the patterned gate insulating layer (hereinafter the gate insulating layer) 300*a*, according to an example embodiment. The gate 400 may be provided on the gate insulating layer 300*a* above the semiconductor region 110C. Seen from above, the gate 400 may have a structure that is the same as or similar to that of the gate G10 of FIG. 2.

Figure 7F:
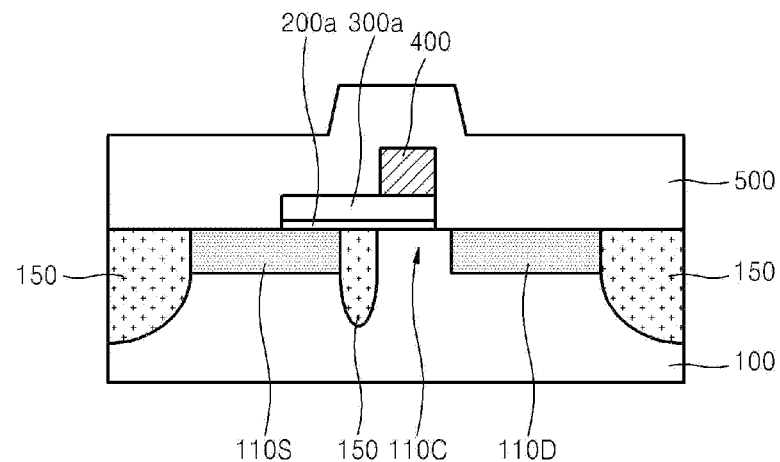

Referring to FIG. 7F, a passivation layer 500 covering the source region 110S, the drain region 110D, the gate insulating layer 300*a*, and the gate 400 may be formed on the substrate 100, according to an example embodiment. The passivation layer 500 may, for example, be formed of silicon oxide, silicon nitride, silicon oxynitride, or an organic insulating material.

Figure 7G:
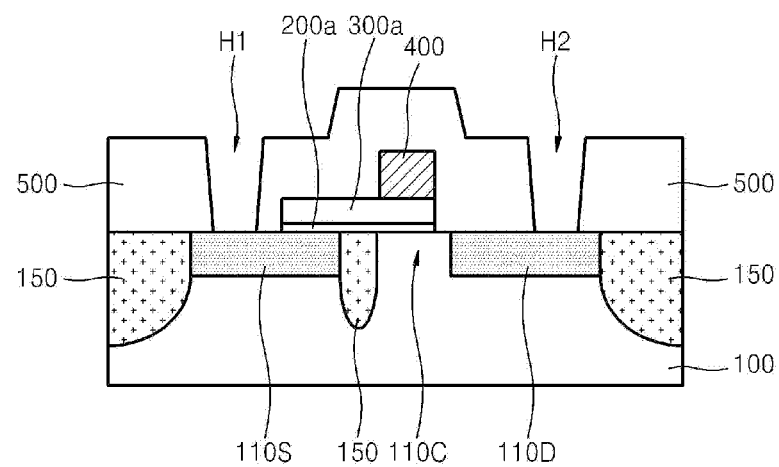

Referring to FIG. 7G, a first contact hole H1 and a second contact hole H2 exposing the source region 110S and the drain region 110D may be formed by etching portions of the passivation layer 500, according to an example embodiment.

Figure 7H:
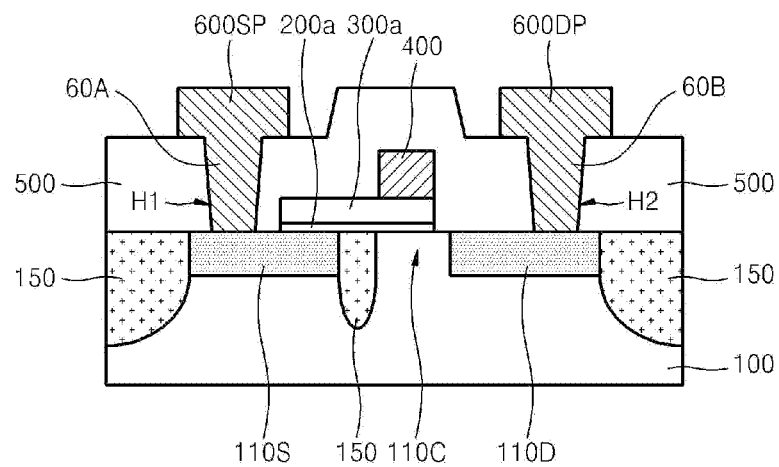

Referring to FIG. 7H, a source pad 600SP and a drain pad 600DP may be formed on the passivation layer 500, according to an example embodiment. The source pad 600SP may be electrically connected to the source region 110S by a first plug 60A formed inside the first contact hole H1, and the drain pad 600DP may be electrically connected to the drain region 110D by a second plug 60B formed inside the second contact hole H2. The source pad 600SP and the drain pad 600DP may be formed of various metals or metal compounds. A planar structure of the main elements of the semiconductor device of FIG. 7H may, for example, be the same as the planar structure of FIG. 2.

FIGS. 8A through 8H are cross-sectional views for describing a method of manufacturing a semiconductor device according to another example embodiment.

Figure 8A:
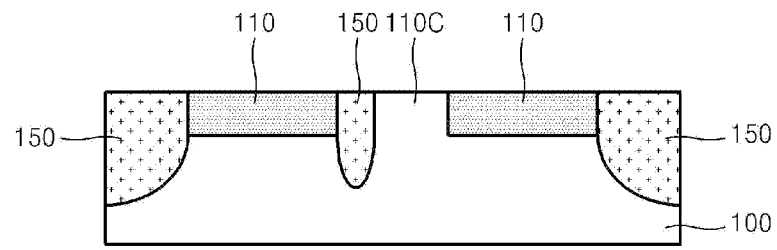
FIGS. 8A through 8H are cross-sectional views for describing a method of manufacturing a semiconductor device according to another example embodiment.

Referring to FIG. 8A, an isolation layer 150 and a doping region 110 may be formed on a substrate 100 in a similar method to that of FIGS. 7A and 7B, according to an example embodiment. Two doping regions 110 may be spaced apart from each other and a semiconductor region 110C may be provided therebetween. The doping region 110 may be regions similar to the source region 110S and the drain region 110D of FIG. 7B. An impurity doping concentration of the doping region 110 may be higher than an impurity doping concentration of the substrate 100, and may be the same as or lower than an impurity doping concentration of the source region 110S and the drain region 110D.

Figure 8B:
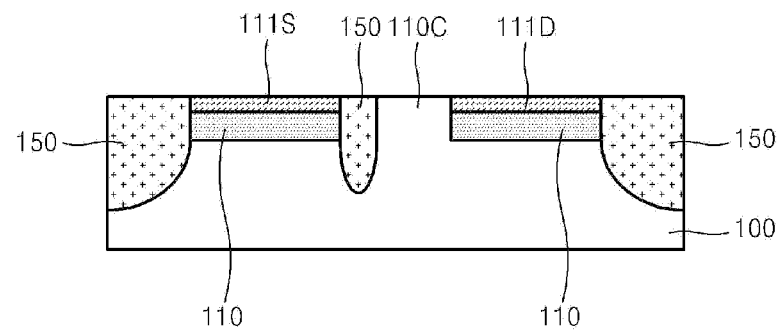
Figure 8C:
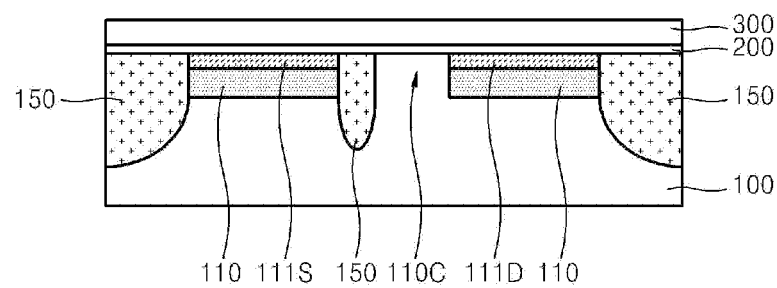
Figure 8D:
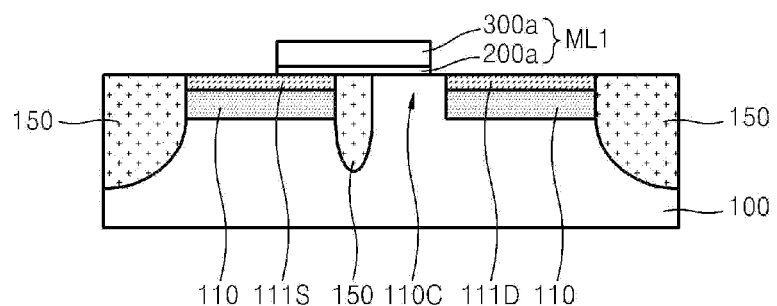
Figure 8E:
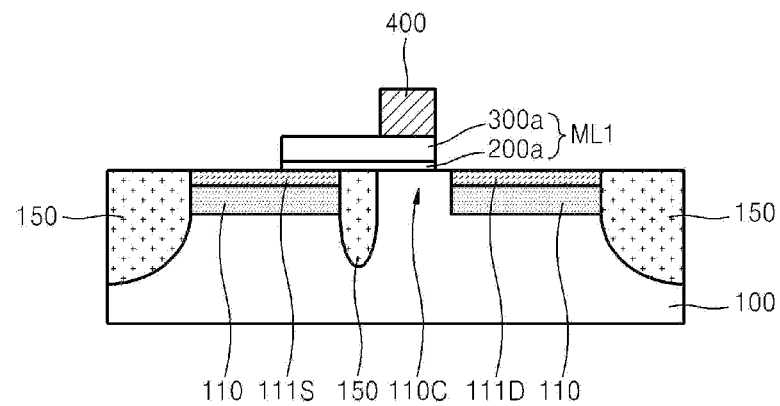
Figure 8F:
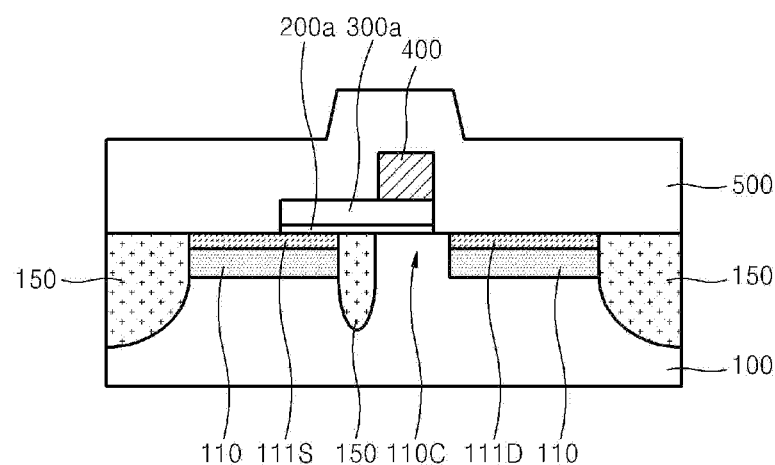
Figure 8G:
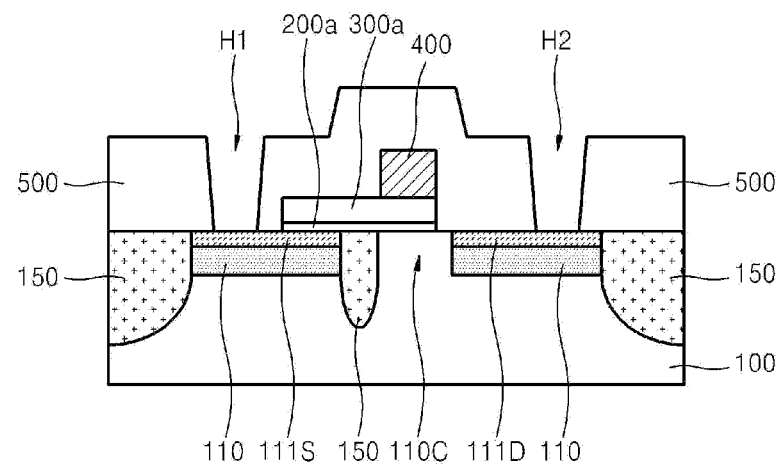
Figure 8H:
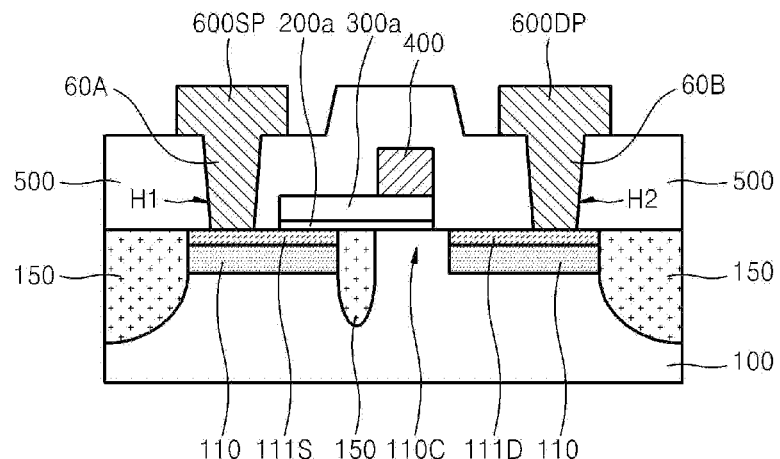

Referring to FIG. 8B, a source region 111S and a drain region 111D including metal silicide may be formed by a metal silicide process with respect to an upper surface portion of the doping region 110, according to an example embodiment. The source region 111S and the drain region 111D may be the same as or similar to the source region S11' and the drain region D11' of FIG. 4. After forming a mask layer (not shown) covering the remaining region except for an upper surface of the doping region 110, a desired (or, alternatively, predetermined) metal layer (not shown) may be formed on the doping region 110 and the mask layer, and then, the source region 111S and the drain region 111D may be formed by a silicide reaction process between the metal layer and silicon of the doping region 110. After the source region 111S and the drain region 111D are formed, the remaining metal layer and the mask layer may be removed. Then, if necessary, a planarization process, for example, a CMP process may be performed with respect to surfaces of the source region 111S, the drain region 111D, and the isolation layer 150.

According to an example embodiment, the semiconductor device may be manufactured by sequentially performing operations as illustrated in FIGS. 8C through 8H. The operations of FIGS. 8C through 8H may correspond to those of FIGS. 7C through 7H, and thus, their descriptions will be omitted.

According to the example method of FIGS. 8A through 8H, the semiconductor device having the same (similar) structure as FIG. 4 may be manufactured. If the source region and the drain region are formed by performing a silicide process without the doping region 110, a semiconductor device that is the same as the semiconductor device of FIG. 3 may be manufactured.

FIGS. 9A through 9I are cross-sectional views for describing a method of manufacturing a semiconductor device according to yet another example embodiment. The example embodiment shows a method of manufacturing the semiconductor device by using a SOI substrate as a starting substrate.

Figure 9A:
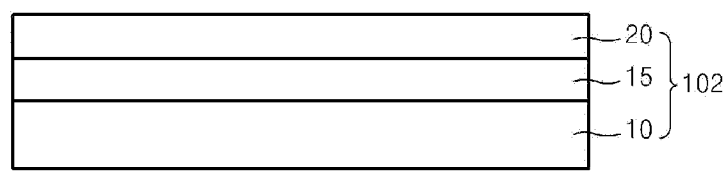
FIGS. 9A through 9I are cross-sectional views for describing a method of manufacturing a semiconductor device according to yet another example embodiment.

Referring to FIG. 9A, a substrate 102 may be prepared in accordance with an example embodiment. The substrate 102 may be, for example, a SOI substrate. In this case, the substrate 102 may include a lower silicon layer 10, an insulating layer 15, and an upper silicon layer 20. The insulating layer 15 may be provided between the lower silicon layer 10 and the upper silicon layer 20. The insulating layer 15 may, for example, be formed of silicon oxide. The upper silicon layer 20 may be p-type or n-type silicon, and a doping concentration thereof may be the same as that of the substrate SUB10 of FIG. 1.

Figure 9B:
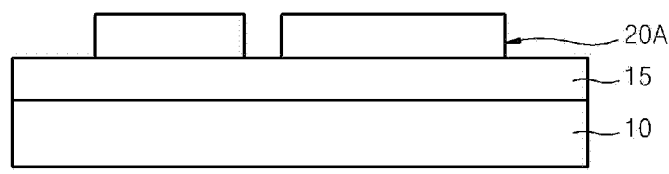

Referring to FIG. 9B, a patterned upper silicon layer 20A may be formed by patterning the upper silicon layer 20, according to an example embodiment. The patterned upper silicon layer 20A may correspond to a "device region" or an "active region." The patterned upper silicon layer 20A may have the same (similar) planar structure as a structure combining the source region S10, the drain region D10, and the semiconductor region C10 of FIG. 2.

Figure 9C:
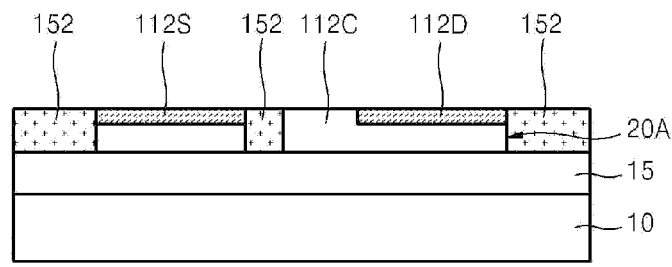
Figure 9D:
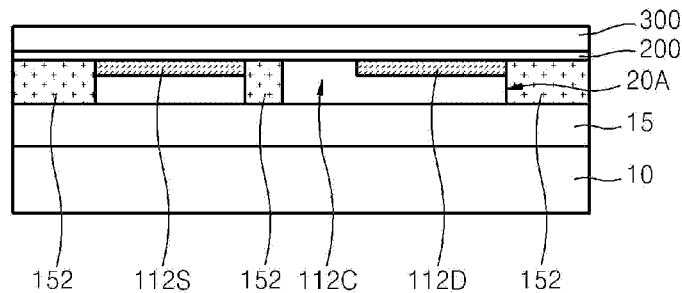
Figure 9E:
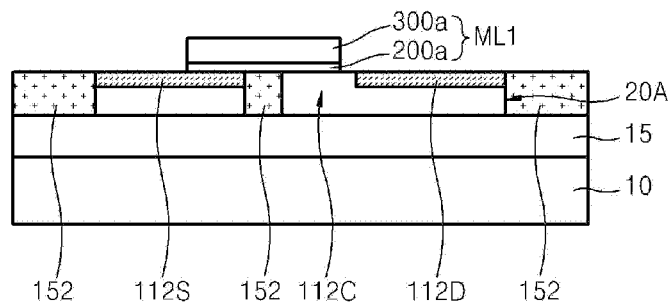
Figure 9F:
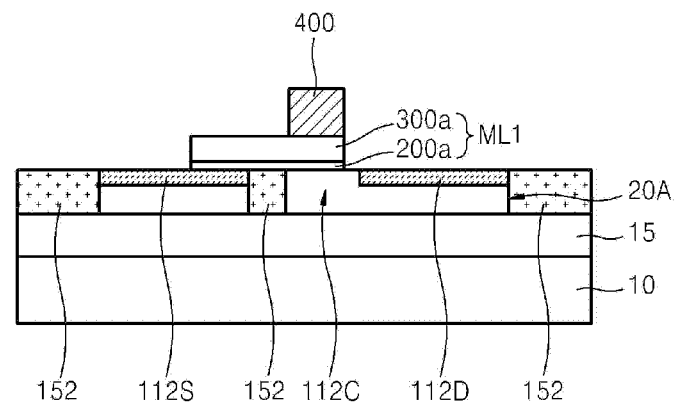
Figure 9G:
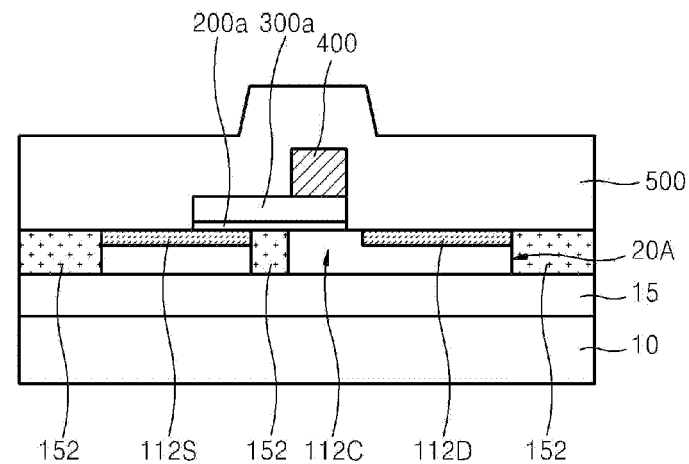
Figure 9H:
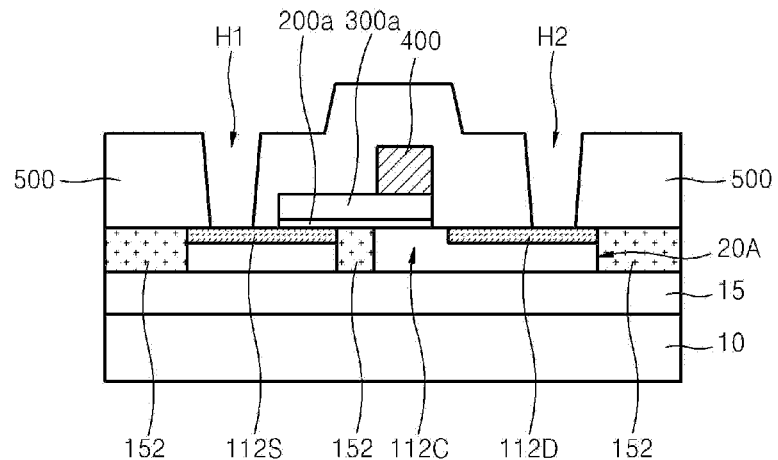
Figure 9I:
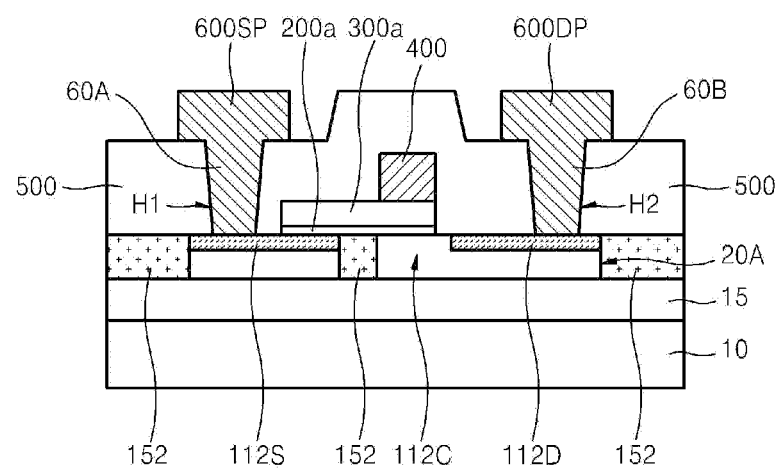

Referring to FIG. 9C, an isolation layer 152 may be formed around the patterned upper silicon (hereinafter the upper silicon) 20A, according to an example embodiment. For example, a source region 112S and a drain region 112D may be formed in a portion of the upper silicon layer 20A. The source region 112S and the drain region 112D may, for example, be formed by a metal silicide process. However, the method of forming the source region 112S and the drain region 112D may vary. For example, the source region 112S and the drain region 112D may be formed by implanting impurity ions in a high concentration, or by other methods. A semiconductor region (a semiconductor element) 112C may be defined in the upper silicon layer 20A between the source region 112S and the drain region 112D. The semiconductor region 112C may be spaced apart from the source region 112S and may contact the drain region 112D. In the process of forming the isolation layer 152, or after the process of forming the source region 112S and the drain region 112D, a planarization process, for example, a CMP process, with respect to surfaces of the upper silicon layer 20A and the isolation layer 152, may be performed.

The semiconductor device may be manufactured by sequentially performing operations as illustrated in FIGS. 9D through 9I, according to an example embodiment. The operations of FIGS. 9D through 9I may correspond to those of FIGS. 7C through 7H, and thus, their descriptions will be omitted.

According to the example method of FIGS. 9A through 9I, the semiconductor device having the same (similar) structure as that of FIG. 5 may be manufactured.

FIGS. 10A through 10I are cross-sectional views for describing a method of manufacturing a semiconductor device according to yet another example embodiment. The example embodiment illustrates a case in which a source element 113S and a drain element 113D are formed of a metal or a metal compound.

Figure 10A:
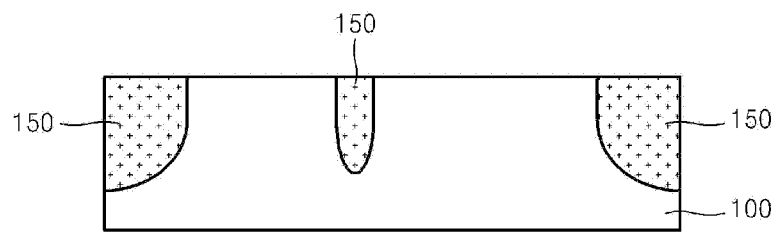
FIGS. 10A through 10I are cross-sectional views for describing a method of manufacturing a semiconductor device according to yet another example embodiment.

Referring to FIG. 10A, an isolation layer 150 defining a desired (or, alternatively, predetermined) device region may be formed in an upper surface portion of a substrate 100, in a similar method to that of FIG. 7A, according to an example embodiment.

Figure 10B:
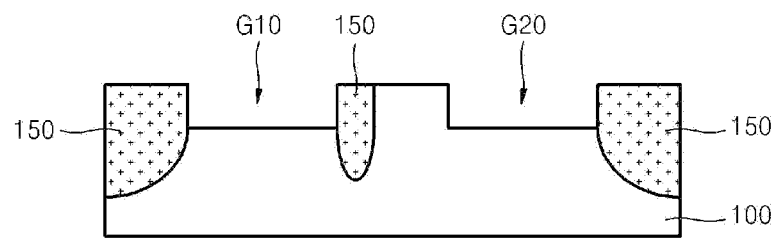

Referring to FIG. 10B, a first groove G10 and a second groove G20 may be formed in the device region defined by the isolation layer 150, according to an example embodiment. The first and second grooves G10 and G20 may be a space for forming the source element 113S and the drain element 113D.

Figure 10C:
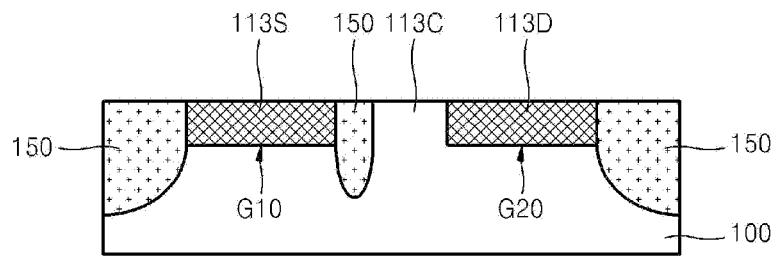
Figure 10D:
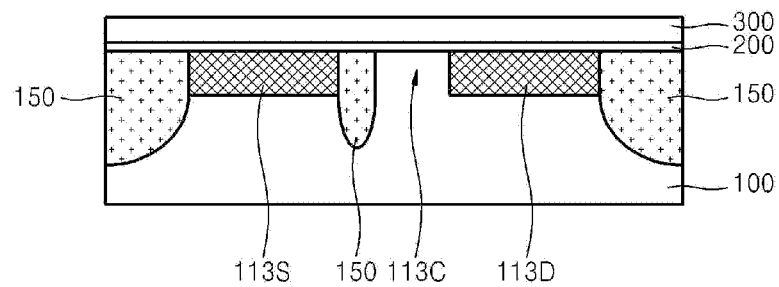
Figure 10E:
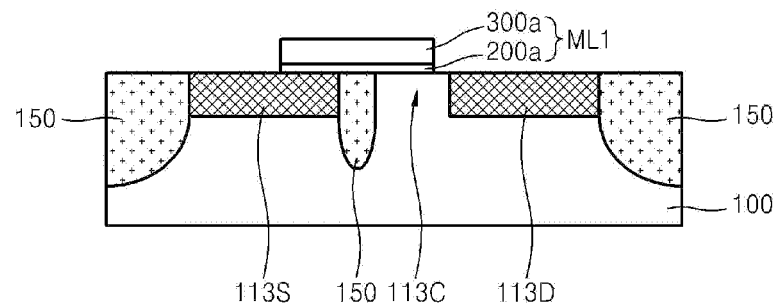
Figure 10F:
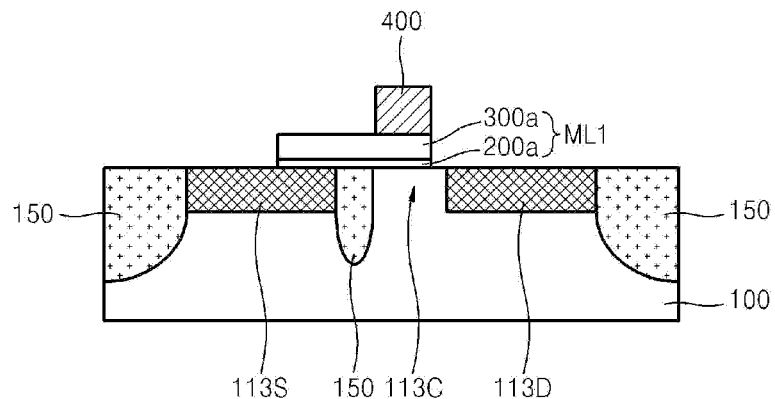
Figure 10G:
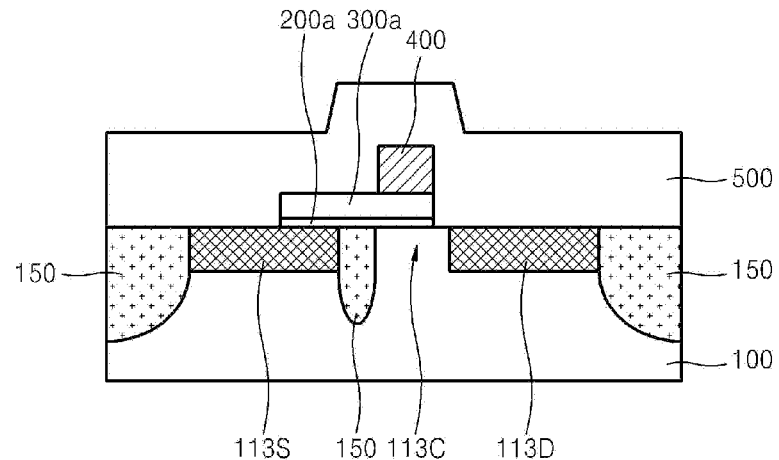
Figure 10H:
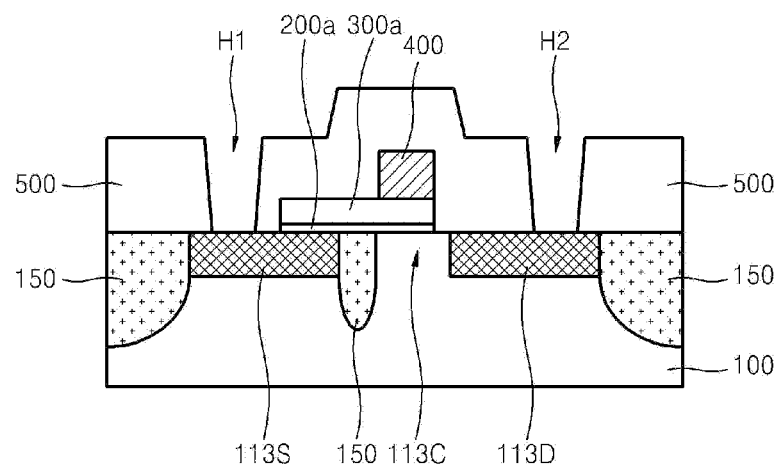
Figure 10I:
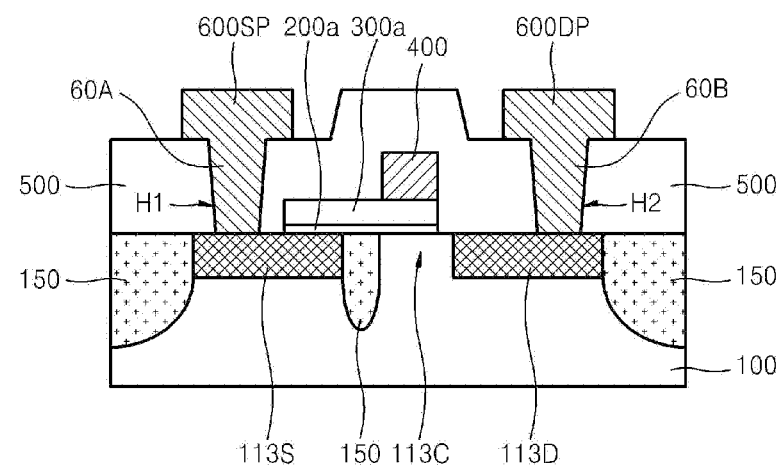

Referring to FIG. 10C, the source element 113S and the drain element 113D may be formed in the first groove G10 and the second groove G20, respectively, according to an example embodiment. The source element 113S and the drain element 113D may be formed of a metal or a metal compound. For example, the source element 113S and the drain element 113D may be formed to include at least one of various metals and metal compounds, such as Ti, Al, Au, TiN, Pt, Ni, or the like. After a desired (or, alternatively, predetermined) conductive layer filling the first and second grooves G10 and G20 is formed on the substrate 100, the source element 113S and the drain element 113D may be formed by performing a CMP process or an etch-back process with respect to the conductive layer. Thus, the source element 113S, the drain element 113D, the semiconductor element 113C, and the isolation layer 150 may form a flat (an almost flat) surface. Even if there is a level difference between surfaces of the source element 113S and the drain element 113D and a surface of the isolation layer 150, the difference may be as small as about 5 nm or less or about 3 nm or less. Also, even if there is a level difference between the surfaces of the source element 113S and the drain element 113D and a surface of the semiconductor region 113C, the difference may be as small as about 5 nm or less or about 3 nm or less, according to an example embodiment.

The semiconductor device may be manufactured by sequentially performing operations as illustrated in FIGS. 10D through 10I, according to an example embodiment. The operations of FIGS. 10D through 10I may correspond to those of FIGS. 7C through 7H, and thus, their descriptions will be omitted.

According to the method of FIGS. 10A through 10I, the semiconductor device having a same (or, alternatively, similar) structure as that of FIG. 6 may be manufactured.

The manufacturing methods described above may be changed in various ways, according to an example embodiment. For example, when a CMP process is used in a planarization process of a surface of a substrate structure on which the graphene layer 200 is formed (or, alternatively, transferred), an etch stop layer may selectively be used. The example in which the etch stop layer is used will be described by referring to FIGS. 11A through 11E, FIGS. 12A through 12E, and FIGS. 13A through 13E.

FIGS. 11A through 11E are cross-sectional views for describing a method of manufacturing a semiconductor device according to yet another example embodiment.

Figure 11A:
FIGS. 11A through 11E are cross-sectional views for describing a method of manufacturing a semiconductor device according to yet another example embodiment.

Referring to FIG. 11A, an etch stop layer 120 may be formed on the substrate 100. The etch stop layer 120 may be, for example, a silicon nitride ($Si_3N_4$) layer, but it may vary.

Figure 11B:
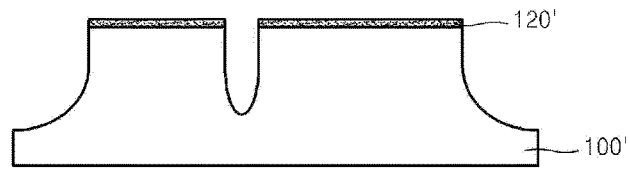

Referring to FIG. 11B, the etch stop layer 120 and an upper surface portion of the substrate 100 may be patterned (or, alternatively, etched). Reference numerals 100' and 120' denote a patterned substrate and a patterned etch stop layer, respectively.

Figure 11C:
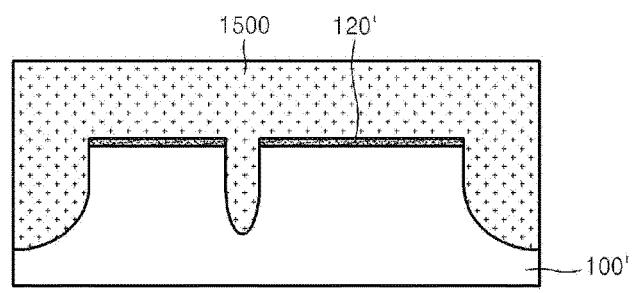

Referring to FIG. 11C, a desired (or, alternatively, predetermined) isolation material layer 1500 may be formed on the patterned substrate (hereinafter the substrate) 100' and the patterned etch stop layer (hereinafter the etch stop layer) 120'.

According to an example embodiment, a CMP process may be performed with respect to a surface of the isolation material layer 1500. Here, the etch stop layer 120 may have a lower etch speed than the isolation material layer 1500, and thus, the CMP process may be easily stopped at a point in which the etch stop layer 120' is exposed, and the substrate 100' under the etch stop layer 120' may not be damaged.

Figure 11D:
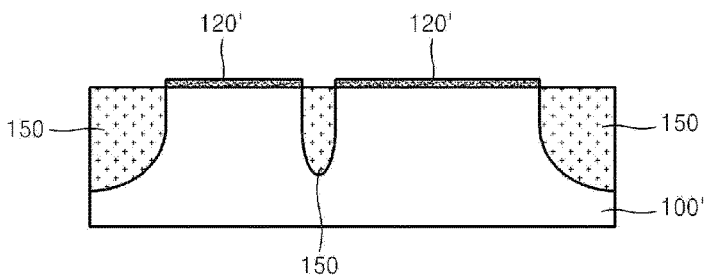

As a result of the CMP process, the structure as illustrated in FIG. 11D may be obtained, according to an example embodiment. Referring to FIG. 11D, the isolation layer 150 may be disposed in the upper surface portion of the substrate 100', and the etch stop layer 120' may be disposed on an exposed surface (the upper surface) of the substrate 100'.

Figure 11E:
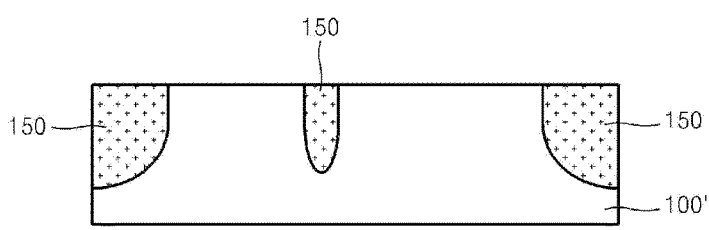

According to an example embodiment, by selectively removing the etch stop layer 120' the substrate structure as illustrated in FIG. 11E may be obtained. The structure of FIG. 11E may be similar to that of FIG. 7A. Thus, the semiconductor device may be manufactured by performing the operations of FIGS. 7B through 7H with respect to the substrate structure of FIG. 11E.

FIGS. 12A through 12E are cross-sectional views for describing a method of manufacturing a semiconductor device according to yet another example embodiment. The example embodiment shows a case in which when a starting substrate is a SOI substrate, the etch stop layer described above is implemented.

Figure 12A:
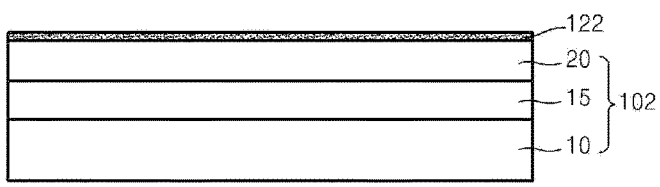
FIGS. 12A through 12E are cross-sectional views for describing a method of manufacturing a semiconductor device according to yet another example embodiment.

Referring to FIG. 12A, a substrate 102 having a SOI structure may be prepared, according to an example embodiment. The substrate 102 may include a lower silicon layer 10, an insulating layer 15, and an upper silicon layer 20. The etch stop layer 122 may be formed on the upper silicon layer 20. The etch stop layer 122 may be a silicon nitride ($Si_3N_4$) layer, but it may vary.

Figure 12B:
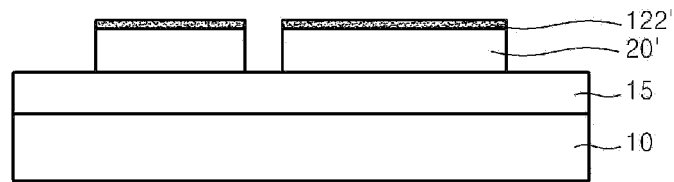

Referring to FIG. 12B, the etch stop layer 122 and the upper silicon layer 20 may be patterned (or, alternatively, etched), according to an example embodiment. Reference numerals 20' and 122' denote patterned upper silicon and patterned etch stop layer, respectively.

Figure 12C:
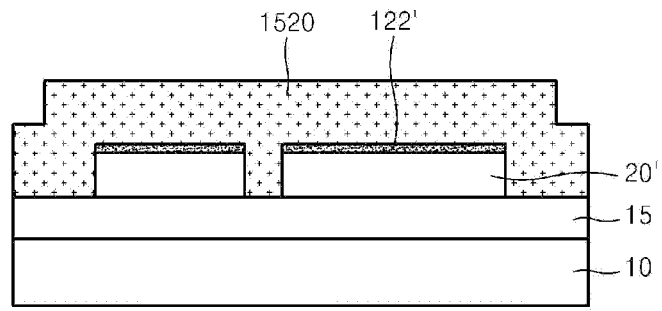

Referring to FIG. 12C, a desired (or, alternatively, predetermined) isolation material layer 1520 may be formed on the patterned upper silicon (hereinafter the upper silicon) 20' and the patterned etch stop layer (hereinafter the etch stop layer) 122' according to an example embodiment.

Figure 12D:
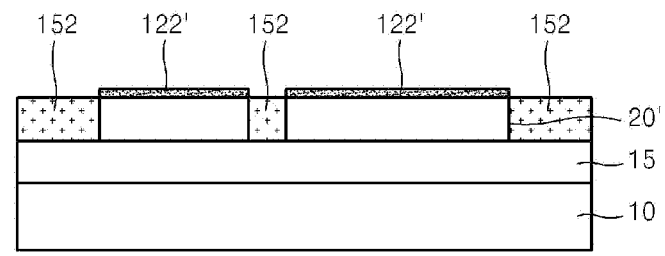

A CMP process may be performed with respect to a surface of the isolation material layer 1520, according to an example embodiment. As a result, the substrate structure as illustrated in FIG. 12D may be obtained. Referring to FIG. 12D, the isolation layer 152 is provided around the upper silicon layer 20' and the etch stop layer 122' may be provided on an exposed surface (upper surface) of the upper silicon layer 20'.

Figure 12E:
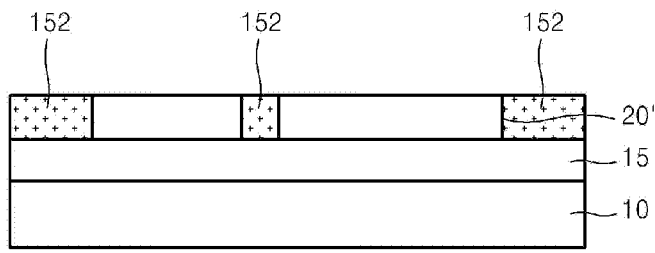

By selectively removing the etch stop layer 122', the substrate structure as illustrated in FIG. 12E may be obtained, according to an example embodiment. The structure of FIG. 12E may be similar to a structure prior to forming the source region 112S and the drain region 112D in FIG. 9C. Thus, the semiconductor device may be manufactured by performing the operations of FIGS. 9C through 9I with respect to the substrate structure of FIG. 12E.

FIGS. 13A through 13E are cross-sectional views for describing a method of manufacturing a semiconductor device according to yet another example embodiment. The example embodiment shows a case in which when the source element 113S and the drain element 113D are formed of a metal or a metal compound, the etch stop layer described above is used.

Figure 13A:
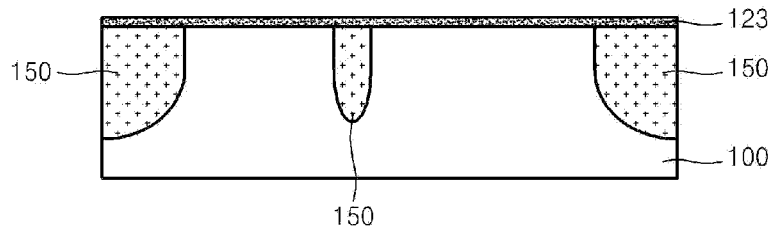
FIGS. 13A through 13E are cross-sectional views for describing a method of manufacturing a semiconductor device according to yet another example embodiment.

Referring to FIG. 13A, an isolation layer 150 defining a desired (or, alternatively, predetermined) device region may be formed in an upper surface portion of a substrate 100, in a similar method to that of FIG. 10A, according to an example embodiment. An etch stop layer 123 may be formed on the substrate 100 and the isolation layer 150.

Figure 13B:
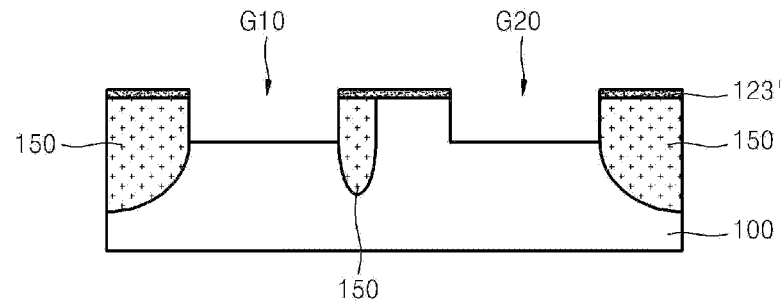

Referring to FIG. 13B, a first groove G10 and a second groove G20 may be formed by etching the etch stop layer 123 and the device region under the etch stop layer 123, according to an example embodiment. Reference numeral 123 denotes a patterned etch stop layer.

Figure 13C:
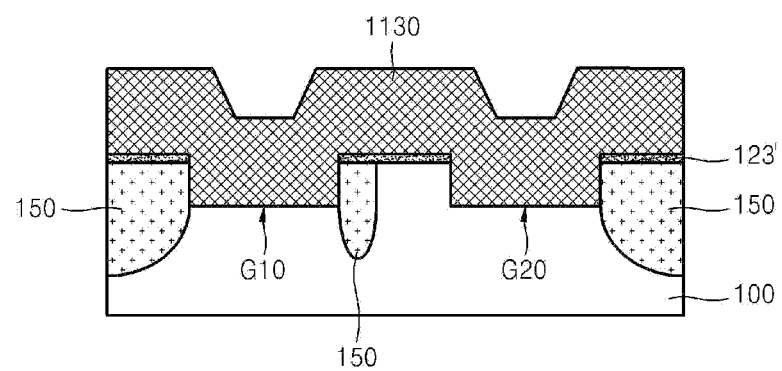

Referring to FIG. 13C, a conductive layer 1130 filling the first and second grooves G10 and G20 may be formed on the substrate 100. The conductive layer 1130 may be formed to include a metal or a metal compound.

Figure 13D:
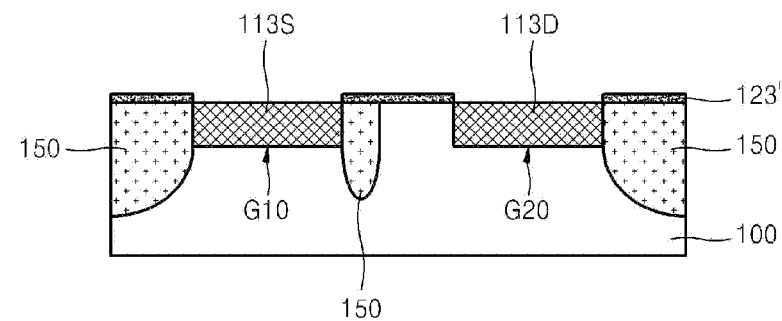

According to an example embodiment, a CMP process may be performed with respect to a surface of the conductive layer 1130. As a result, the structure as illustrated in FIG. 13D may be obtained. Referring to FIG. 13D, a source element 113S may be provided in the first groove G10, and a drain element 113D may be provided in the second groove G20. The etch stop layer 123 may be disposed around the source element 113S and the drain element 113D.

Figure 13E:
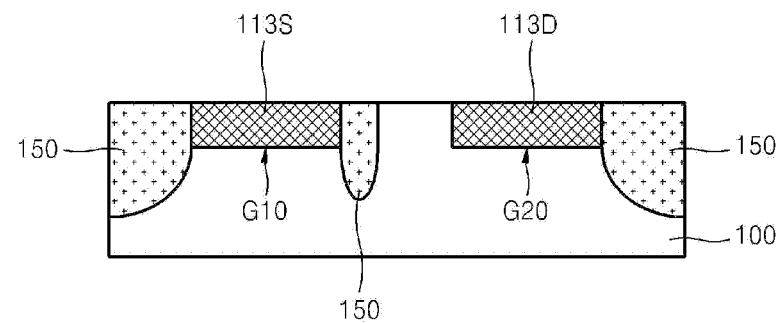

According to an example embodiment, by selectively removing the etch stop layer 123, the substrate structure as illustrated in FIG. 13E may be obtained. The structure of FIG. 13E may be similar to that of FIG. 10C. Thus, the semiconductor device may be manufactured by performing the operations of FIGS. 10D through 10I with respect to the substrate structure of FIG. 13E.

As described by referring to FIGS. 11A through 11E, FIGS. 12A through 12E, and FIGS. 13A through 13E, when the etch stop layer 120, 122, and 123 is used, the CMP process may be more easily (or, alternatively, more smoothly) performed, according to an example embodiment.

It should be understood that the example embodiments described therein should be considered in a descriptive sense only and not for purposes of limitation. For example, it will be understood by those of ordinary skill in the art that the structure of the semiconductor device of FIGS. 1 through 6 may vary. For example, other materials than graphene may be used. Also, as a semiconductor element contacting graphene, semiconductors, such as an oxide semiconductor, other than Si, Ge, SiGe, and strained Si, may be used. It will also be understood that the structure and material of the source, the drain, and the gate may vary. Furthermore, the manufacturing method described above with reference to FIGS. 7A through 7H, FIGS. 8A through 8H, FIGS. 9A through 9I, FIGS. 10A through 10I, FIGS. 11A through 11E, FIGS. 12A through 12E, and FIGS. 13A through 13E may also vary. Additionally, it will be understood by those of ordinary skill in the art that the idea may apply to other device than a transistor.

While one or more example embodiments have been described with reference to the figures, it will be understood by those of ordinary skill in the art that various changes in form and details may be made therein without departing from the spirit and scope as defined by the following claims.

The invention claimed is:

1. A semiconductor device comprising:
    a source and a drain that are spaced apart from each other;
    a semiconductor element between the source and the drain, the semiconductor element being spaced apart from the source and contacting the drain;
    a graphene layer on the source and the semiconductor element to connect the source and the semiconductor element, the graphene layer being spaced apart from the drain;
    a gate insulating layer on the graphene layer; and
    a gate on the gate insulating layer;
    wherein a level difference between surfaces of the source and the drain and a surface of the semiconductor element is about 5 nm or less.

2. The semiconductor device of claim 1, wherein surfaces of the source and the drain are substantially co-planar with a surface of the semiconductor element.

3. The semiconductor device of claim 1, wherein an isolation layer is provided between the source and the semiconductor element, and a level difference between surfaces of the source and the drain and a surface of the isolation layer is about 5 nm or less.

4. The semiconductor device of claim 1, wherein the graphene layer has a flat structure.

5. The semiconductor device of claim 1, wherein the semiconductor element comprises one of an n-type semiconductor and a p-type semiconductor.

6. The semiconductor device of claim 1, wherein the semiconductor element comprises at least one selected from the group consisting of silicon (Si), germanium (Ge), silicon germanium (SiGe), and strained Si.

7. A semiconductor device comprising:
    a source and a drain that are spaced apart from each other;
    a semiconductor element between the source and the drain, the semiconductor element being spaced apart from the source and contacting the drain;

a graphene layer on the source and the semiconductor element to connect the source and the semiconductor element, the graphene layer being spaced apart from the drain;

a gate insulating layer on the graphene layer;

a gate on the gate insulating layer;

a passivation layer covering at least a portion of the source, the drain, the gate insulating layer, and the gate; and a source pad and a drain pad that are provided on the passivation layer and are electrically connected to the source and the drain, respectively.

8. The semiconductor device of claim 1, wherein the source and the drain each comprise an impurity-doped region.

9. The semiconductor device of claim 1, wherein at least one of the source and the drain comprises metal silicide.

10. The semiconductor device of claim 1, wherein at least one of the source and the drain comprises a metal or a metal compound.

11. The semiconductor device of claim 1, wherein at least one of the source and the drain is on at least one of a silicon substrate and a silicon-on-insulator (SOI) substrate.

12. The semiconductor device of claim 1, wherein the semiconductor device comprises a barristor device structure.

13. A method of manufacturing a semiconductor device, the method comprising:

preparing a device region comprising a source, a drain, and a semiconductor element between the source and the drain, the semiconductor element being spaced apart from the source and contacting the drain, wherein a level difference between surfaces of the source and the drain and a surface of the semiconductor element is about 5 nm or less;

forming a graphene layer on the source and the semiconductor element, the graphene layer being spaced apart from the drain;

forming a gate insulating layer on the graphene layer; and forming a gate on the gate insulating layer above the semiconductor element.

14. The method of claim 13, wherein the preparing of the device region comprises:

forming an isolation layer in a substrate, wherein the isolation layer defines regions for the source, the drain, and the semiconductor element; and performing a planarization process with respect to surfaces of the source, the drain, the semiconductor element and the isolation layer, wherein surfaces of the source and the drain are substantially co-planar with a surface of the semiconductor element.

15. The method of claim 14, wherein the planarization process comprises a chemical mechanical polishing (CMP) process, wherein an etch stop layer is selectively used in the CMP process.

16. The method of claim 13, wherein the device region is on a silicon substrate or a silicon-on-insulator (SOI) substrate.

17. The method of claim 13, wherein each of the source and the drain comprise an impurity-doped region.

18. The method of claim 13, wherein at least one of the source and the drain comprises metal silicide.

19. The method of claim 13, wherein at least one of the source and the drain comprises a metal or a metal compound.

\* \* \* \* \*